(12) United States Patent
Woo et al.

(10) Patent No.: US 9,188,851 B2
(45) Date of Patent: Nov. 17, 2015

(54) PATTERN MASK AND METHOD OF MANUFACTURING THIN FILM PATTERN USING PATTERN MASK

(71) Applicant: SAMSUNG DISPLAY CO., LTD., Yongin, Gyeonggi-Do (KR)

(72) Inventors: Jun Hyuk Woo, Yongin-si (KR); Min Kang, Seoul (KR); Bong-Yeon Kim, Seoul (KR); Jeong Won Kim, Suwon-si (KR); Jin Ho Ju, Seoul (KR); Tae Gyun Kim, Yongin-si (KR); Chul Won Park, Gwangmyeong-si (KR); Hyun Joo Lee, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 209 days.

(21) Appl. No.: 13/829,521

(22) Filed: Mar. 14, 2013

(65) Prior Publication Data

US 2014/0065523 A1    Mar. 6, 2014

(30) Foreign Application Priority Data

Sep. 4, 2012    (KR) .................. 10-2012-0097861

(51) Int. Cl.
*G03F 9/00*    (2006.01)
*G03F 1/00*    (2012.01)
(52) U.S. Cl.
CPC ...................... *G03F 1/00* (2013.01)

(58) Field of Classification Search
CPC ........................................................ G03F 9/00
USPC ...................... 430/5, 322, 323, 324
See application file for complete search history.

(56) References Cited

U.S. PATENT DOCUMENTS

| 7,112,390 | B2 | 9/2006 | Kang et al. | |
|---|---|---|---|---|
| 2003/0198875 | A1* | 10/2003 | Kim et al. | 430/5 |
| 2005/0102648 | A1 | 5/2005 | Hsu et al. | |
| 2006/0019176 | A1 | 1/2006 | Kim et al. | |
| 2006/0068334 | A1 | 3/2006 | Sandstrom et al. | |
| 2009/0104542 | A1 | 4/2009 | Nyhus et al. | |
| 2011/0195349 | A1 | 8/2011 | Anderson et al. | |

FOREIGN PATENT DOCUMENTS

| JP | 2007-233138 | 9/2007 |
|---|---|---|
| JP | 2007-241136 | 9/2007 |
| KR | 10-2007-0002629 | 1/2007 |
| KR | 10-2009-0045440 | 5/2009 |
| KR | 10-2009-0052700 | 5/2009 |
| KR | 10-2009-0112464 | 10/2009 |
| KR | 10-2011-0001144 | 1/2011 |
| KR | 10-1084000 | 11/2011 |

OTHER PUBLICATIONS

English Abstract for Publication No. 10-2007-0002629.
English Abstract for Publication No. 2007-233138.

(Continued)

*Primary Examiner* — Stephen Rosasco
(74) *Attorney, Agent, or Firm* — F. Chau & Associates, LLC

(57) ABSTRACT

A pattern mask for patterning a thin film includes a transparent or translucent substrate with a plurality of grooves formed thereon having a pitch of about 4.6 μm to about 10.8 μm.

14 Claims, 15 Drawing Sheets

(56) References Cited

OTHER PUBLICATIONS

English Abstract for Publication No. 2007-241136.
English Abstract for Publication No. 10-2009-0045440.
English Abstract for Publication No. 10-2009-0052700.
English Abstract for Publication No. 10-2009-0112464.
English Abstract for Publication No. 10-2011-0001144.
English Abstract for Publication No. 10-1084000.
Chris A. Mack, et al., "The Lithography Expert: Using the Normalized Image Log-Slope Part 6: Development Path," Microlithography World. May 2002.

* cited by examiner

PATTERN MASK AND METHOD OF MANUFACTURING THIN FILM PATTERN USING PATTERN MASK

CROSS REFERENCE TO RELATED APPLICATIONS

This application claims priority from Korean Patent Application No. 10-2012-0097861 filed in the Korean Intellectual Property Office on Sep. 4, 2012, the entire contents of which are herein incorporated by reference in their entirety.

BACKGROUND (a) Technical Field

Embodiments of the present disclosure are directed to a pattern mask and a method of manufacturing a thin film pattern using a pattern mask.

(b) Discussion of the Related Art

Semiconductor devices and flat panel displays are generally fabricated using thin film processes, and thin film line widths have decreased due to increased device miniaturization. To obtain a small thin film line width, a light source of an exposure device or an exposure lens may be changed, which may be costly.

SUMMARY

A pattern mask for patterning a thin film according to an embodiment of the present disclosure includes a transparent or translucent substrate having a plurality of grooves formed thereon having a pitch of about 4.6 μm to about 10.8 μm.

The pitch of the grooves may be from about 4.6 μm to about 8.8 μm.

The pitch of the grooves may be from about 5.1 μm to about 10.8 μm.

Each groove may have a depth of about 260 nm to about 680 nm.

The pattern mask may have a refractive index of about 1.5.

The pattern mask may include quartz or glass.

The pattern mask according to an embodiment of the present invention may include a plurality of opaque members disposed on the substrate and having a pitch greater than about 8.8.

The pitch of the opaque member may be greater than about 10.8.

method of manufacturing a thin film pattern according to an embodiment of the present invention includes: depositing a photosensitive layer on a thin film; exposing the photosensitive layer through a pattern mask; developing the exposed photosensitive layer; etching the thin film using the developed photosensitive layer as an etch mask to form a plurality of thin film members; and removing the developed photosensitive layer, wherein the pattern mask has a groove having a pitch of about 4.6 μm to about 10.8 μm.

The pattern mask may include a plurality of opaque members having a pitch greater than about 10.8 μm.

Each groove may have a depth of about 260 nm to 680 nm.

The thin film members may have a pitch that is half the pitch of the grooves.

The pattern mask may have a refractive index of about 1.5.

The pattern mask may include quartz or glass.

A pattern mask for patterning a thin film according to another embodiment of the present disclosure includes a substrate formed of a transparent or translucent material and having a plurality of periodically spaced grooves formed thereon, wherein a groove pitch and a groove depth are determined to optimize light transmission through the pattern mask and light intensity contrast of light that has passed through the pattern mask.

The pitch of the grooves may be at least twice as large as a width of each groove.

The groove pitch and the groove depth may be determined so that the light intensity contrast is greater than or equal to about 0.5 and an image log slope is greater than or equal to about 0.8.

The groove pitch may be from about 4.6 μm to about 10.8 μm.

The groove depth may be from about 260 nm to about 680 nm.

The pattern mask may have a refractive index of about 1.5.

DETAILED DESCRIPTION OF EXEMPLARY EMBODIMENTS

Figure 1:
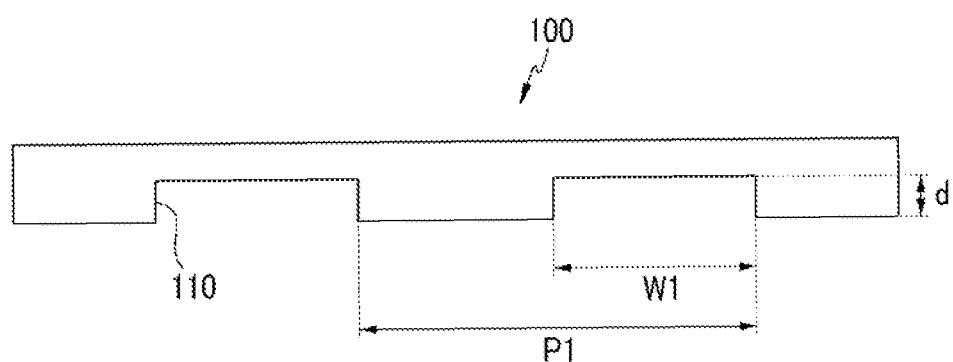
FIG. 1 is a schematic sectional view of a pattern mask according to an embodiment of the present disclosure.

Aspects of the embodiments will be described more fully hereinafter with reference to the accompanying drawings. As those skilled in the art would realize, the described embodiments may be modified in various different ways, all without departing from the spirit or scope. In the drawing, the same or similar reference numerals designate the same or similar elements throughout the specification.

It will be understood that when an element such as a layer, film, region, or substrate is referred to as being "on" another element, it can be directly on the other element or intervening elements may also be present.

A pattern mask according to an embodiment of the present disclosure is described in detail with reference to FIG. 1.

FIG. 1 is a schematic sectional view of a pattern mask according to an embodiment of the present disclosure.

Referring to FIG. 1, a pattern mask 100 according to an embodiment of the present disclosure may be a substantially flat panel, and has at least one groove 110. The pattern mask 100 may include a transparent or translucent material, for example, an insulator such as quartz or glass, and may have a refractive index of about 1.5.

Each groove 110 may have a width W1 of about 2.3 µm to about 5.4 µm and a depth d of about 260 nm to about 680 nm. A distance between the grooves 110 may be equal to or greater than the width W1 of the groove 110, and a pitch P1 may be defined as a minimum distance between centers of the grooves 110. Therefore, the pitch P1 of the groove 110 may be at least twice the width of the groove 110, for example, from about 4.6 µm to about 10.8 µm. Furthermore, the pitch P1 of the groove 110 may be from about 5.1 µm to about 10.8 µm, or from about 4.6 µm to about 8.8 µm.

The pattern mask 100 may be used in a photolithographic process to form a thin film pattern, for example, which is described in detail with reference to FIG. 2 to FIG. 6.

Figure 2:
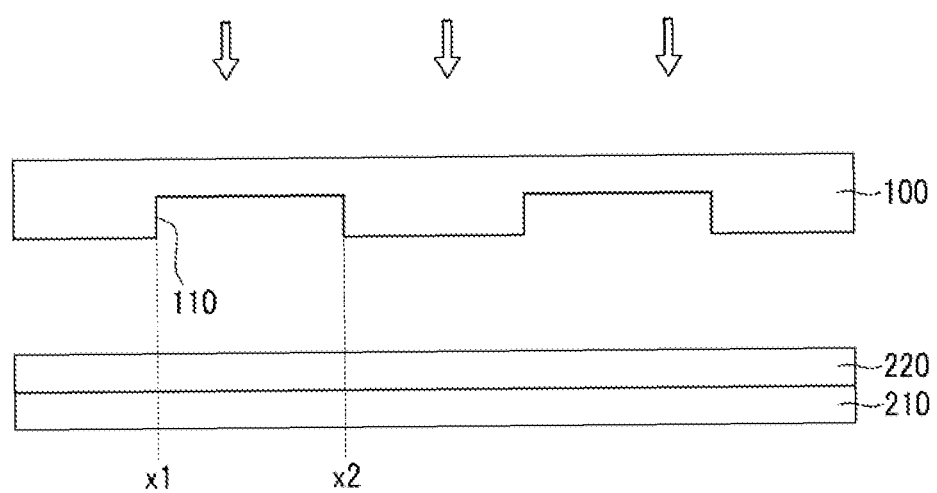
FIG. 2 and FIG. 4 to FIG. 6 are schematic sectional views illustrating a method of forming a thin film pattern according to an embodiment of the present disclosure.
Figure 3:
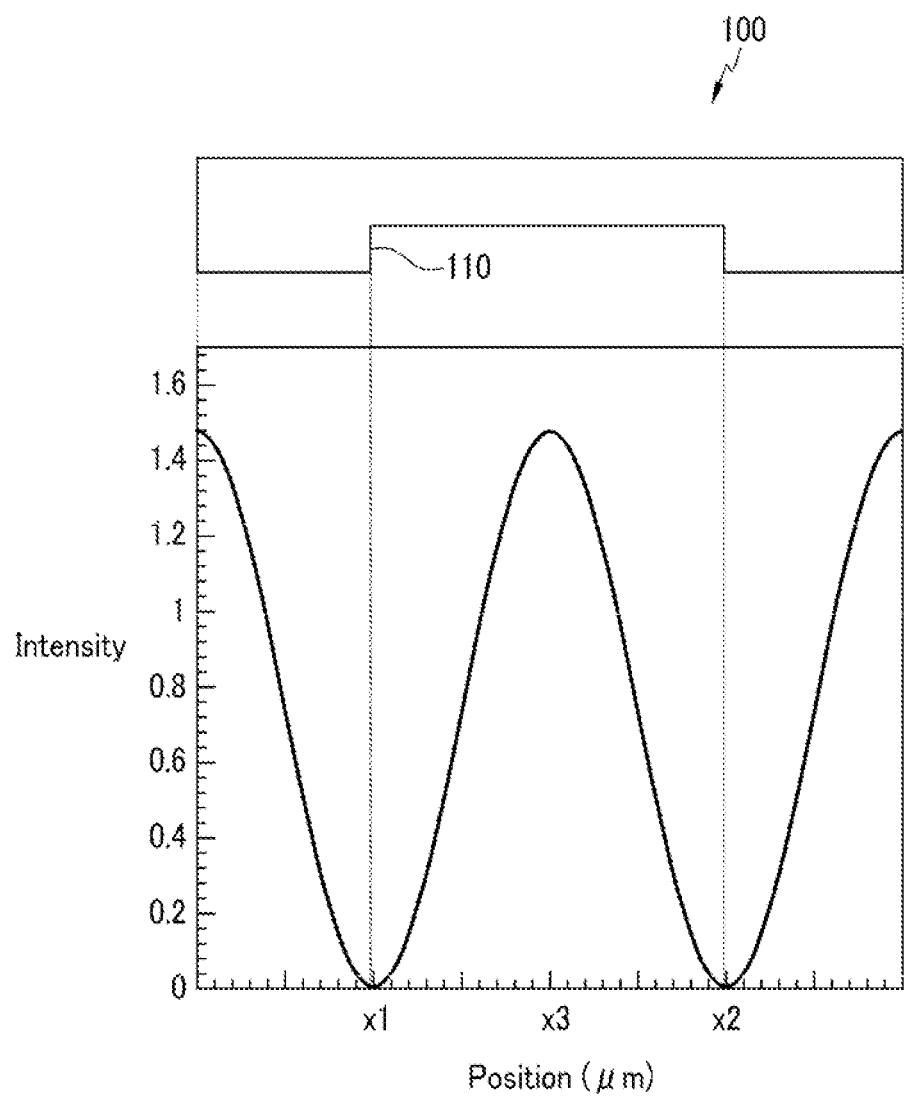
FIG. 3 is a graph illustrating the intensity of light passing through a pattern mask according to an embodiment of the present disclosure.

FIG. 2 and FIG. 4 to FIG. 6 are schematic sectional views illustrating a method of forming a thin film pattern according to an embodiment of the present disclosure, and FIG. 3 is a graph illustrating the intensity of light passing through a pattern mask according to an embodiment of the present disclosure.

Referring to FIG. 2, a photosensitive layer, such as a positive photosensitive layer 220, is coated on a thin film 210 to be patterned. The pattern mask 100 is aligned with the photosensitive layer 220, and the photosensitive layer 220 is exposed to light through the pattern mask 100. The illuminating light may be a mixture of wavelengths of about 435 nm, about 405 nm, and about 365 nm, but is not limited thereto.

Referring to FIG. 3, the intensity of the light passing through the pattern mask 100 may be lowest at positions x1 and x2 corresponding to boundaries of the groove 110, and may be highest at positions x3 corresponding to a center of the groove 110. The intensity pattern is the result of interference due to optical path differences, that is, interference between light passing through the groove 110 and light passing through portions of the pattern mask 100 other than the groove 110. The light intensity values shown in FIG. 3 are calculated relative to incident light.

Figure 4:
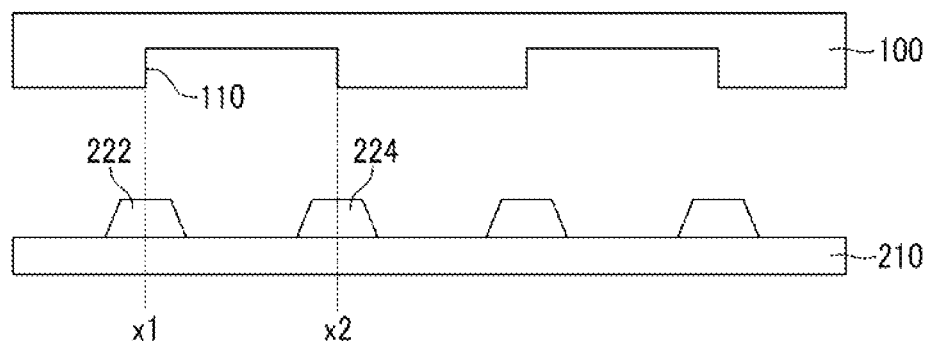

Therefore, the photosensitive layer 220 receives the most intense light at the position x3 corresponding to the center of the groove 110, and the least intense light at the positions x1 and x2 corresponding to the boundaries of the groove 110. The development of the photosensitive layer 220 leaves photosensitive layer portions 222 and 224 around the positions x1 and x2 corresponding to the boundaries of the groove 110 as shown in FIG. 4.

Figure 5:
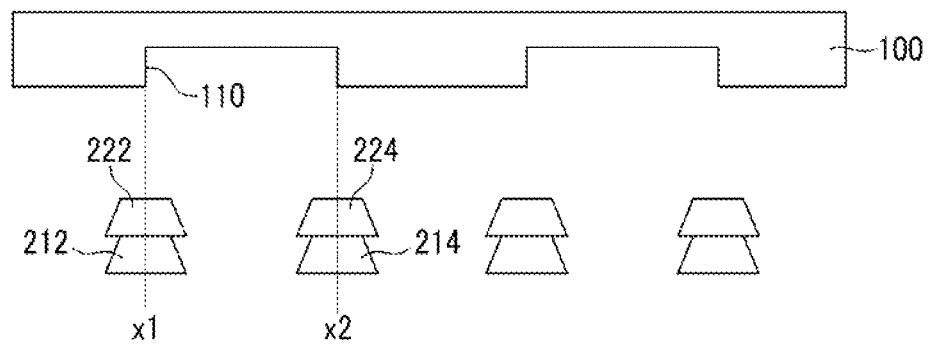

Referring to FIG. 5, the thin film 210 is etched using the photosensitive layer portions 222 and 224 as an etch mask such that portions of the thin film 210, which are not covered by the photosensitive layer portions 222 and 224, are removed, and portions 212 and 214 of the thin film 210 are left remaining under the photosensitive layer portions 222 and 224.

Figure 6:
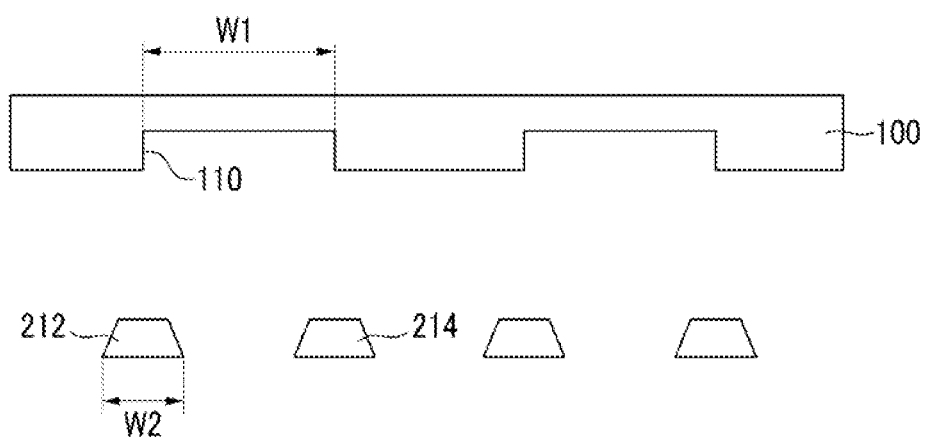

Referring to FIG. 6, finally, the photosensitive layer portions 222 and 224 are removed to complete the patterning of the thin film 210. A width W2 of each of the thin film portions 212 and 214 may be about a half the width W1 of the groove 110 in the pattern mask 100, and thus the resolution of the resultant thin film pattern may be about twice the resolution of the pattern mask 100. In other words, a thin film pattern having a pitch that is about half the pitch P1 of the groove 110 in the pattern mask 100 may be obtained.

An optimal value of the pitch P1 and the depth of the groove 110 in the pattern mask 100 may be determined from a computer simulation, which is described in detail with reference to FIG. 7 to FIG. 16.

Figure 7:
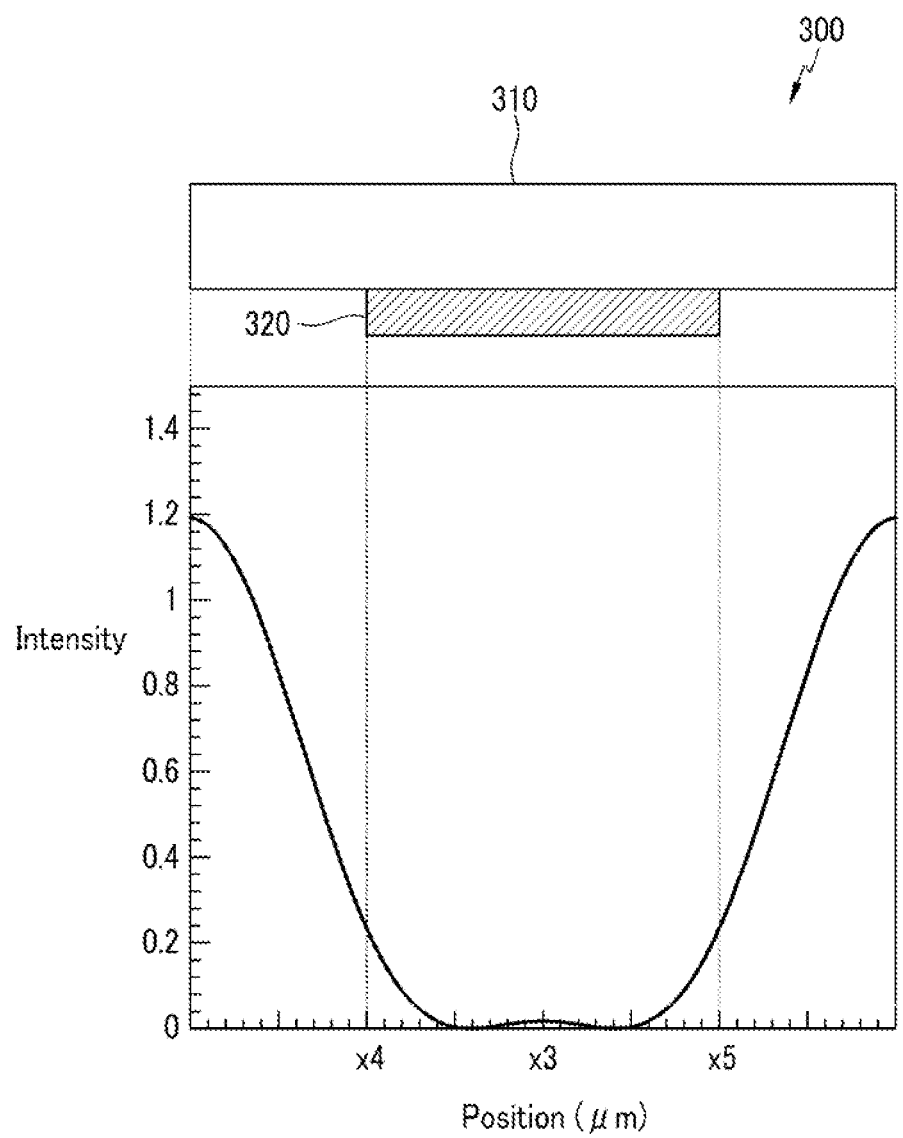
FIG. 7 illustrates a schematic cross-section of a binary mask according to a comparative example and the intensity of light passing through the binary mask.
Figure 8:
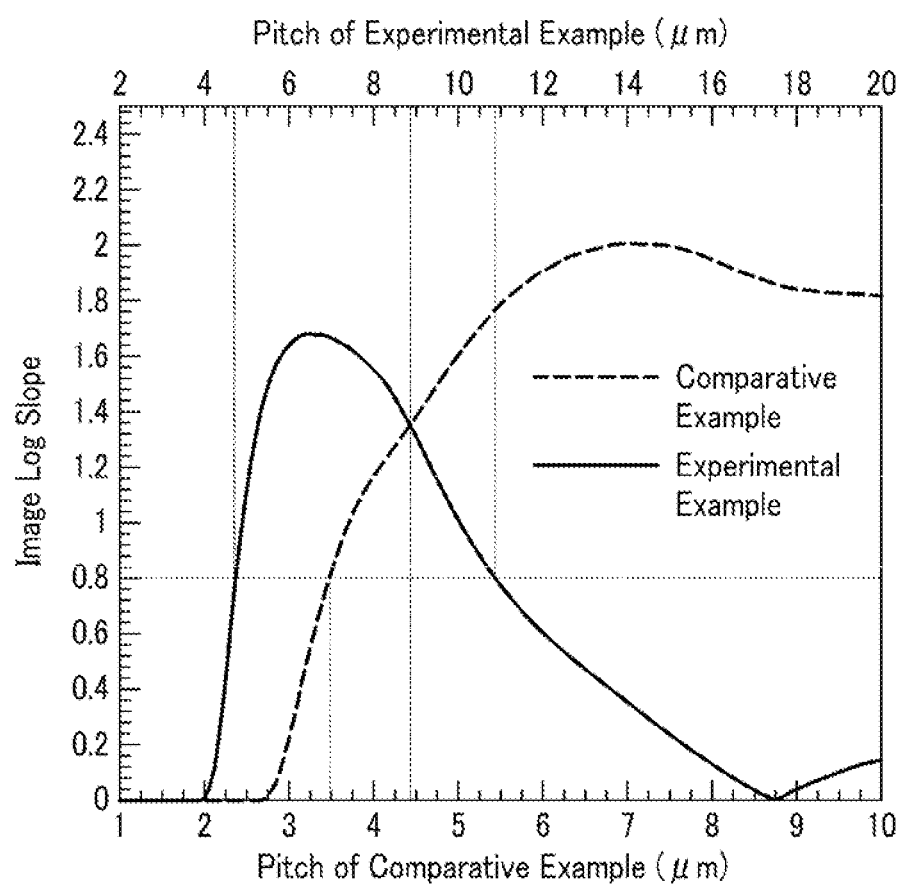
FIG. 8 is a graph illustrating an image log slope of pattern masks according to an experimental example and a comparative example.
Figure 9:
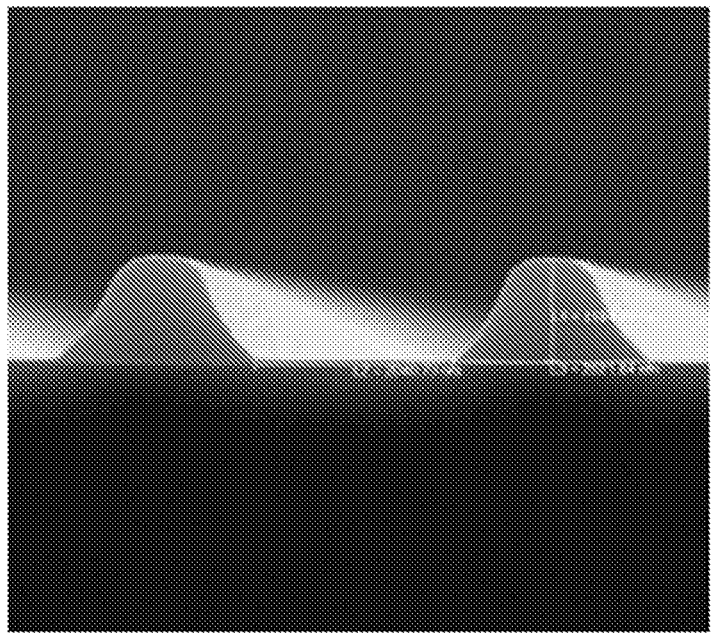
FIG. 9 and FIG. 10 are photographs showing cross-sections of thin film members according to an experimental example.
Figure 10:
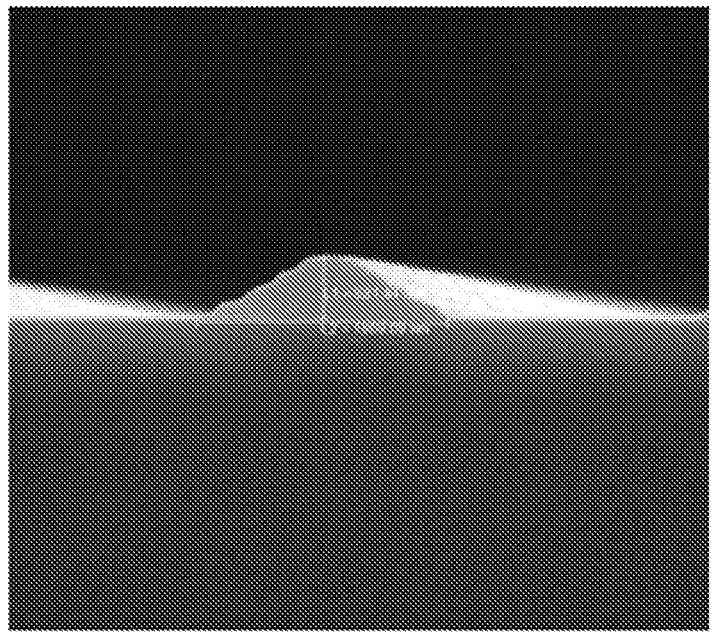

FIG. 7 illustrates a schematic cross-section of a binary mask according to a comparative example and the intensity of light passing through the binary mask, FIG. 8 is a graph illustrating an image log slope of pattern masks according to an experimental example and a comparative example, and FIG. 9 and FIG. 10 are photographs showing cross-sections of thin film members according to an experimental example.

In the simulation, first, an exemplary mask according to an experimental example and a comparative mask according to a comparative example were simulated. The experimental example utilized the pattern mask 100 with the groove 110 as shown in FIG. 3, while the comparative example utilized a binary mask 300 including a transparent substrate 310 and an opaque chromium member 320 disposed thereon as shown in FIG. 7. A pitch P2 may be defined as a minimum distance between centers of the opaque chromium members 320. The exemplary pattern mask 100 and the substrate 310 of the binary mask 300 were made of quartz having refractive index of about 1.5.

Referring to FIG. 7, the intensity of light passing through the binary mask 300 is lowest at a position corresponding to a center of the chromium member 320 and increases with increasing distance from the chromium member 320. Therefore, a thin film member formed using the binary mask 300 may have a width substantially the same as a width of the chromium member 320.

Consequently, when forming thin film members having a pitch, the pitch of the thin film members may be the same as the pitch P2 of the chromium members 320 of the binary mask 300, while the pitch of the thin film members may be about half of the pitch P1 of the grooves 110 of the exemplary pattern mask 100.

By varying the groove pitch P1 in the exemplary pattern mask 100 and the chromium member pitch P2 in the comparative binary mask 300, the simulation can calculate and compare characteristics of light passing through the masks 100 and 300 as functions of the groove pitch P1 and the chromium member pitch P2.

FIG. 8 illustrates a calculated image log slope as a function of pitch. The image log slope denotes a derivative of the intensity of light passing through a mask with respect to distance divided by the intensity. Therefore, the image log slope may be written by (dI/dx)/I, where I is the light intensity.

FIG. 9 shows a cross section of thin film members formed using a pattern mask having an image log slope equal to or greater than about 0.8, and FIG. 10 shows a cross section of a thin film member formed using a pattern mask having an image log slope less than about 0.8. Referring to FIG. 9 and FIG. 10, the lateral slope of the thin film member may be steep enough to form an expected pattern when the image log slope is equal to or greater than about 0.8. However, when the image log slope is less than about 0.8, lateral sides of the thin film member have gentle slopes with a large spread, which may not form the desired pattern.

Therefore, according to an embodiment of the present disclosure, a pattern mask is designed such that the image log slope of light passing through the pattern mask may be equal to or greater than about 0.8.

Referring to FIG. 8, the image log slope of the pattern mask 100, shown by the solid curve, may be equal to or greater than about 0.8 when the groove pitch P1 in the pattern mask 100 is in a range from about 4.6 μm to about 10.8 μm. When the pitch P1 is out of that range, the image log slope may be smaller than about 0.8. Therefore, a pattern mask 100 where the groove pitch P1 is about 4.6 μm to about 10.8 μm may be used to form thin film members having a pitch of about 2.3 μm to about 5.4 μm, which is half of the groove pitch P1. However, an exemplary pattern mask 100 may not be used to form thin film members having a pitch smaller than about 2.3 μm or greater than about 5.4 μm.

For the comparative example using the binary mask 300, the image log slope, shown by the dashed curve, may be equal to or greater than about 0.8 when a chromium member pitch P2 in the binary mask 300 is equal to or greater than about 3.6 μm. When the chromium member pitch P2 is equal to or greater than about 4.4 μm, which may be equivalent to about an 8.8 μm pitch of the exemplary pattern mask 100, the image log slope of the binary mask 300 may be greater than the image log slope of the exemplary pattern mask 100. Therefore, according to an embodiment, thin film members having a pitch equal to or greater than about 4.4 μm may be formed using the binary mask 300 instead of the exemplary pattern mask 100.

The exemplary pattern mask 100 and the comparative binary mask 300 may be fused.

Figure 11:
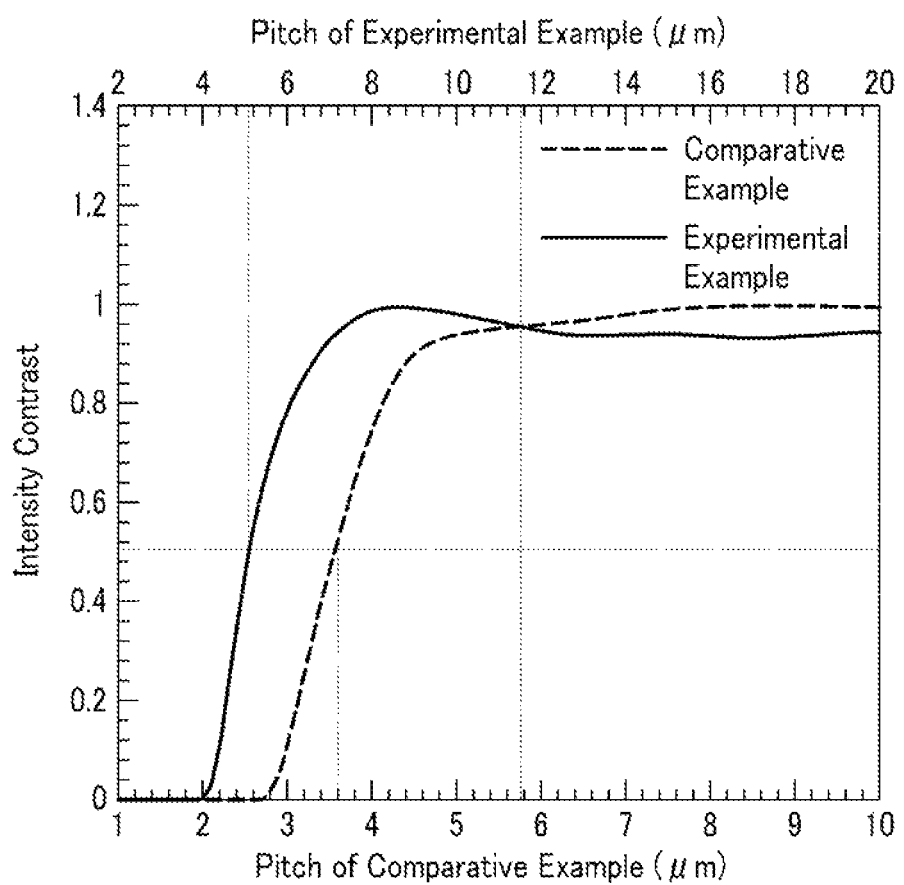
FIG. 11 is a graph illustrating intensity contrast of pattern masks according to an experimental example and a comparative example as function of pitch.

FIG. 11 is a graph of intensity contrast as a function of pitch for a pattern mask according to an experimental example, shown by the solid curve, and a comparative example, shown by the dashed curve.

The intensity contrast $I_c$ is given by $$I_c = (I_{max} - I_{min})/(I_{max} + I_{min}),$$

where $I_{max}$ and $I_{min}$ are the highest value and the lowest value of the intensity of light passing through a mask, respectively.

The intensity contrast may compensate for the image log slope, and the thin film members profiles may improve when the intensity contrast is equal to or greater than about 0.5 in addition to the image log slope being equal to or greater than about 0.8.

Referring to FIG. 11, the intensity contrast may be equal to or greater than about 0.5 when the groove pitch P1 in the exemplary pattern mask 100 is equal to or greater than about 5.1 μm. For the binary mask 300, the intensity contrast may be equal to or greater than about 0.5 when the chromium member pitch P2 is equal to or greater than about 3.6 μm, and the intensity contrast of the binary mask 300 may be greater than the intensity contrast of the pattern mask 100 when the pitch is equal to or greater than about 5.7 μm.

Figure 12:
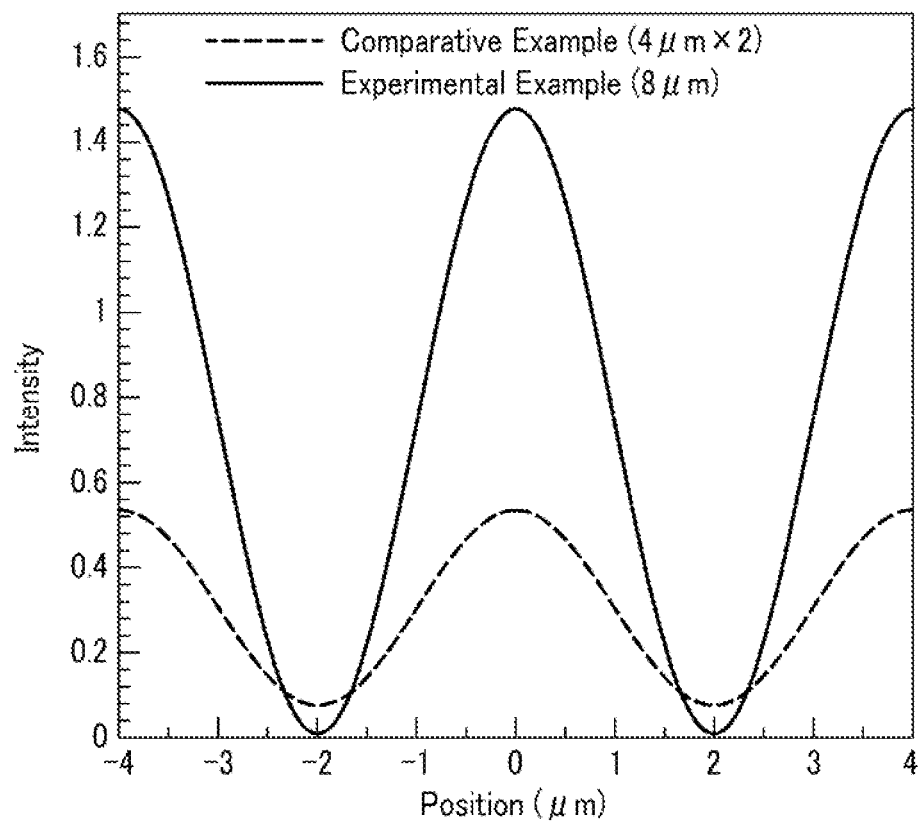
FIG. 12 is a graph illustrating the intensity of light passing through pattern masks according to an experimental example and a comparative example.

FIG. 12 is a graph illustrating the intensity of light passing through a pattern mask according to an experimental example, shown by the solid curve, and a comparative example, shown by the dashed curve, as a function of position.

A groove pitch P1 in an exemplary pattern mask 100 is about 8 μm, and a chromium member pitch P2 in a binary mask 300 is about 4 μm. In detail, referring to FIG. 12, the pattern mask 100 has a groove 110 having a width of about 4 μm that extends from a position of about −2 μm to a position of about 2 μm. The binary mask 300 includes two chromium members 320, each having a width of about 2 μm, one extending from about −3 μm to about −1 μm, and the other from about 1 μm to about 3 μm.

As shown in FIG. 12, the highest light intensity value for the pattern mask 100 is equal to or greater than twice the highest light intensity value for the binary mask 300, and the lowest light intensity value for the pattern mask 100 is very low, resulting in a very high intensity contrast value for the pattern mask 100.

Figure 13:
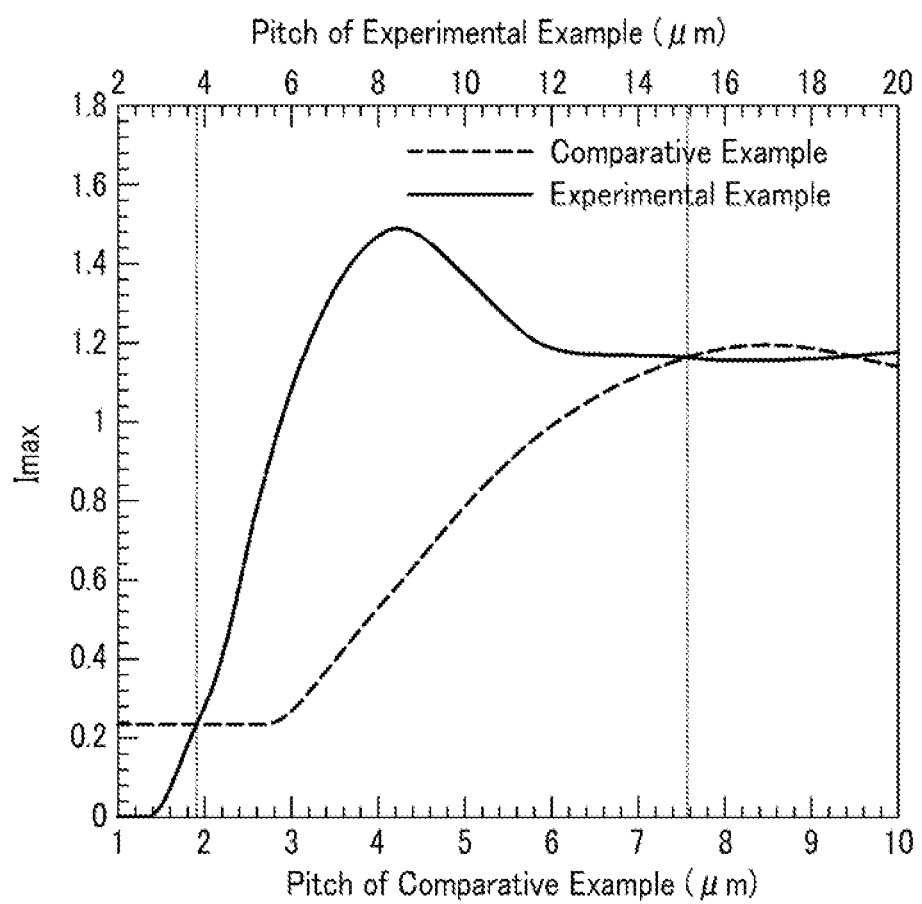
FIG. 13 is a graph illustrating a maximum intensity of light passing through pattern masks as function of pitch according to an experimental example and a comparative example.

FIG. 13 is a graph illustrating a maximum intensity of light passing through pattern masks as function of pitch according to an experimental example, shown by a solid curve, and a comparative example, shown by a dashed curve.

Referring to FIG. 13, the maximum light intensity $I_{max}$ is greater for the pattern mask 100 than for the binary mask 300 when the pattern mask pitch P1 is about 3.8 μm to about 15.1 μm, or equivalently, when the binary mask pitch P2 is about 1.9 μm to about 7.5 μm, Therefore, it may be understood from FIG. 12 and FIG. 13 that a light efficiency is higher for the pattern mask 100 than for the binary mask.

Figure 14:
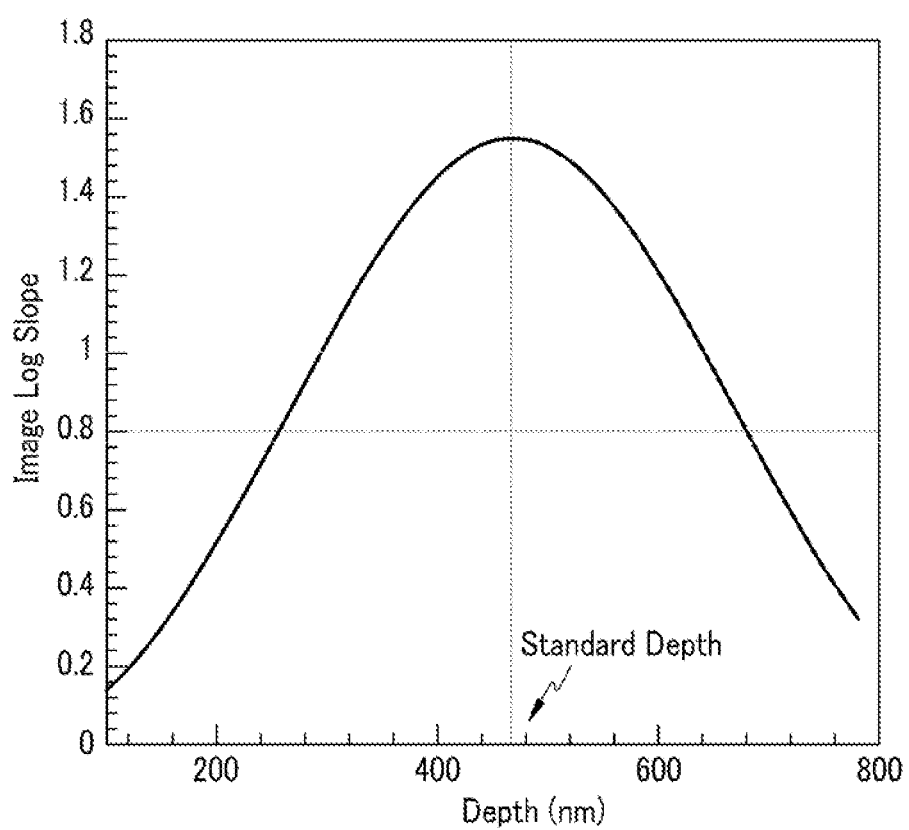
FIG. 14 is a graph illustrating image log slope of an exemplary pattern mask as function of a depth of a groove.
Figure 15:
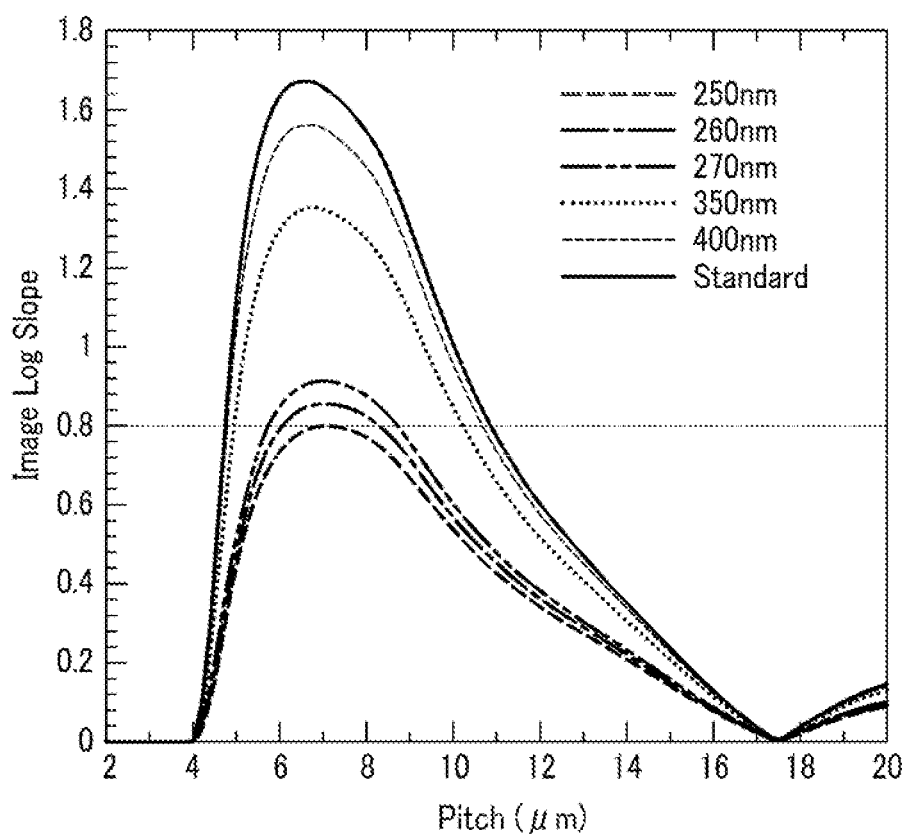
FIG. 15 and FIG. 16 are graphs illustrating image log slope of an exemplary pattern mask for various depths as function of pitch.
Figure 16:
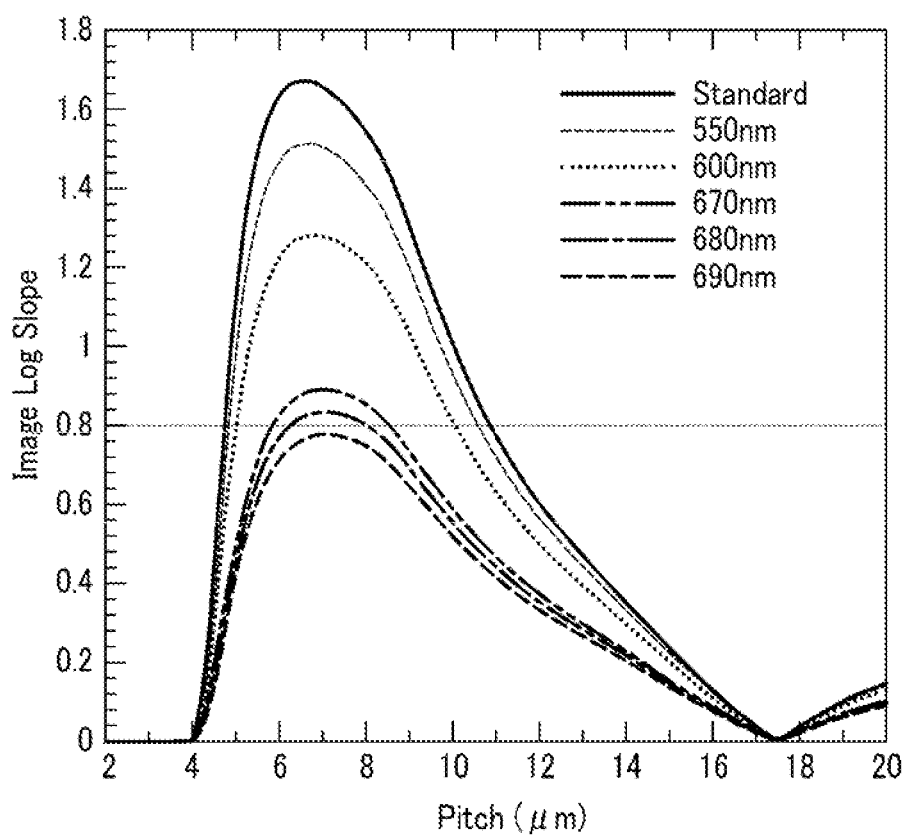

FIG. 14 is a graph illustrating an image log slope of an exemplary pattern mask as a function of a groove depth, and FIG. 15 and FIG. 16 are graphs illustrating the image log slope of an exemplary pattern mask for various depths as a function of pitch.

The image log slope shown in FIG. 14 was obtained by varying the depth of the groove 110 when a groove pitch P1 in an exemplary pattern mask 100 is about 8 μm. The image log slope has a maximum value at a depth, known as the standard depth, and decreases as the depth varies from the standard depth.

For example, the standard depth t may be determined from an equation as follows:

$$\Delta\phi = 360° \times (ni-1) \times t/\lambda,$$

where $\Delta\phi$ denotes a phase shift angle that may be about 180 degrees, ni denotes refractive index, and λ denotes a wavelength of light.

Referring to FIG. 15 and FIG. 16, the image log slope may be equal to or greater than about 0.8 when the depth d of the groove 110 in the exemplary pattern mask 100 is from about 260 nm to about 680 nm.

A pattern mask according to another embodiment is described in detail with reference to FIG. 17.

Figure 17:
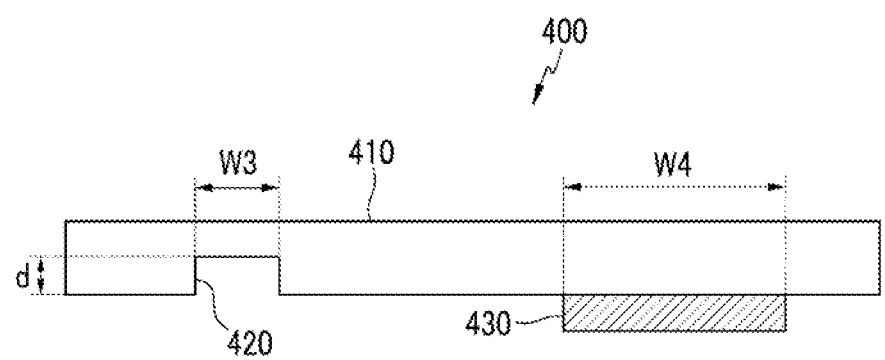
FIG. 17 is a schematic sectional view of a pattern mask according to another embodiment of the present disclosure.

FIG. 17 is a schematic sectional view of a pattern mask according to another embodiment of the present disclosure.

Referring to FIG. 17, a pattern mask 400 according to another embodiment includes a substrate 410 upon which at least one groove 420 and at least one opaque member 430 are disposed.

The substrate 410 may include a transparent or translucent material, such as an insulator such as quartz or glass, and may have a refractive index of about 1.5. A pitch of the groove 420 may be from about 4.6 μm to about 10.8 μm, or from about 4.6 μm to about 8.8 μm, or further from about 5.1 μm to about 10.8 μm. A depth d of the groove 420 may be from about 260 nm to about 680 nm.

The opaque member 430 may include an opaque material, such as chromium, and has a pitch greater than about 8.8 μm or greater than about 10.8 μm. For example, the pitch of the opaque member 430 may be greater than about 10.8 μm when the pitch of the groove 420 is from about 4.6 μm to about 10.8 μm, while the pitch of the opaque member 430 may be greater than about 8.8 μm when the pitch of the groove 420 is from about 4.6 μm to about 8.8 μm While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A pattern mask for patterning a thin film, comprising:
a substrate formed of a transparent or translucent material having a plurality of grooves formed thereon having a pitch of about 4.6 μm to about 10.8 μm.

2. The pattern mask of claim 1, wherein the pitch of the grooves is from about 4.6 μm to about 8.8 μm.

3. The pattern mask of claim 1, wherein the pitch of the grooves is from about 5.1 μm to about 10.8 μm.

4. The pattern mask of claim 1, wherein each groove has a depth of about 260 nm to about 680 nm.

5. The pattern mask of claim 1, wherein the pattern mask has a refractive index of about 1.5.

6. The pattern mask of claim 5, wherein the pattern mask comprises quartz or glass.

7. The pattern mask of claim 1, further comprising
a plurality of opaque members disposed on the substrate and having a pitch greater than about 8.8μm.

8. The pattern mask of claim 7, wherein the pitch of the opaque members is greater than about 10.8μm.

9. A pattern mask for patterning a thin film, comprising:
a substrate formed of a transparent or translucent material and having a plurality of periodically spaced grooves formed thereon, wherein a groove pitch and a groove depth are determined to optimize light transmission through the pattern mask and light intensity contrast of light that has passed through the pattern mask.

10. The pattern mask of claim 9, wherein the pitch of the grooves is at least twice as large as a width of each groove.

11. The pattern mask of claim 9, wherein the groove pitch and the groove depth are determined so that the light intensity contrast is greater than or equal to about 0.5 and an image log slope is greater than or equal to about 0.8.

12. The pattern mask of claim 9, wherein the groove pitch is from about 4.6 μm to about 10.8 μm.

13. The pattern mask of claim 9, wherein the groove depth is from about 260 nm to about 680 nm.

14. The pattern mask of claim 9, wherein the pattern mask has a refractive index of about 1.5.

* * * * *